(12) United States Patent
Yokoyama et al.

(10) Patent No.: US 8,057,151 B2
(45) Date of Patent: Nov. 15, 2011

(54) FOUP DOOR POSITIONING DEVICE FOR FOUP OPENER

(75) Inventors: Sinji Yokoyama, Tokyo (JP); Youichi Matsushita, Tokyo (JP)

(73) Assignee: Hirata Corporation, Tokyo (JP)

( * ) Notice: Subject to any disclaimer, the term of this patent is extended or adjusted under 35 U.S.C. 154(b) by 583 days.

(21) Appl. No.: 12/225,699

(22) PCT Filed: Apr. 11, 2006

(86) PCT No.: PCT/JP2006/307638
§ 371 (c)(1),
(2), (4) Date: Sep. 26, 2008

(87) PCT Pub. No.: WO2007/116527
PCT Pub. Date: Oct. 18, 2007

(65) Prior Publication Data
US 2009/0067955 A1 Mar. 12, 2009

(51) Int. Cl.
*H01L 21/68* (2006.01)
(52) U.S. Cl. ......... 414/411; 414/217; 414/937; 414/939
(58) Field of Classification Search .................. 414/217, 414/411, 937, 939; 29/464
See application file for complete search history.

(56) References Cited

U.S. PATENT DOCUMENTS

| | | | | |
|---|---|---|---|---|
| 6,261,044 B1 * | 7/2001 | Fosnight et al. | ............... | 414/217 |
| 6,398,475 B1 * | 6/2002 | Ishikawa | ........................ | 414/217 |
| 6,530,736 B2 * | 3/2003 | Rosenquist | .................... | 414/411 |
| 7,112,027 B2 * | 9/2006 | Nagata | ........................... | 414/411 |
| 2002/0084389 A1 * | 7/2002 | Larson | ........................ | 248/188.1 |

FOREIGN PATENT DOCUMENTS

| | | |
|---|---|---|
| JP | 09-254068 | 9/1997 |
| JP | 2000-232149 | 8/2000 |
| JP | 2001-248610 | 9/2001 |
| JP | 2002-068362 | 3/2002 |

* cited by examiner

*Primary Examiner* — Scott Lowe
(74) *Attorney, Agent, or Firm* — Bacon & Thomas PLLC

(57) ABSTRACT

The FOUP door positioning device of a FOUP opener is compatible with all kinds of FOUPs, is inexpensive, and has a simple positioning-ping adjustment mechanism.

In a state in which a flange portion (a portion having a taper 13) of a proximal end portion of a positioning pin 10 is seated in a recess portion 31 of a port door 30, and an air suction bore 14 of the positioning pin 10 and an air suction bore 32 of the port door 30 are aligned with each other, a pin insertion hole 23 of a suction pad 20 is fitted to a straight portion 11 of the positioning pin 10, and the suction pad 20 is screwed to the port door 30. By this procedure, the suction pad 20 is attached to the outer surface of the port door 30, and a portion of the suction pad 20 which is sunk into a recess portion 31 presses the flange portion of the proximal end portion of the positioning pin 10. A reinforcing metal plate 25 is embedded in a base portion 21 of the suction pad 20.

9 Claims, 2 Drawing Sheets

FOUP DOOR POSITIONING DEVICE FOR FOUP OPENER

TECHNICAL FIELD

The present invention relates to a FOUP door positioning device of a FOUP opener, and more particularly to a FOUP door positioning device of a FOUP opener having high versatility, a simple structure, and an inexpensive FOUP door positioning adjustment mechanism.

BACKGROUND ART

A FOUP opener is adapted to open a FOUP door for establishing communication between a first controlled space within a FOUP and a second controlled space within a processing apparatus without involvement of exposure of workpieces (semiconductor substrates, glass substrates, etc.) contained in the FOUP to the atmosphere of an external contaminated space in the course of transfer of the workpieces. Thus, a port door belonging to the FOUP opener is provided with positioning pins (also called alignment pins) in accordance with the SEMI standard, for the purpose of establishing accurate positional alignment between the port door and the FOUP door. The positioning pins are attached to the port door in such a manner as to project from the outer surface of the port door. When the FOUP (Front-Opening Unified Pod) is placed on a placement table of the FOUP opener, and then the placement table advances, the positioning pins are inserted into respective pin bores provided in the FOUP door. Through insertion of the positioning pins of the port door into the pin bores of the FOUP door, the FOUP door and the port door are aligned with each other at a preset position.

However, the FOUP may be deformed in the course of repeated use of the FOUP, or pin bores of the FOUP from a certain maker may have positional errors that have arisen in the course of manufacture. As a result, the pin bores may slightly deviate from required positions. Since conventional positioning pins are attached perpendicularly and fixedly to the port door, a positional misalignment between the positioning pins of the port door and the pin bores of the FOUP door causes collision of the positioning pins with the FOUP door. Consequently, the port door and the FOUP door fail to be properly aligned with each other, resulting in a failure to open and close the FOUP.

In order to avoid the above-mentioned problem, an invention described in Japanese Patent Application Laid-Open (kokai) No. 2002-68362 has been conceived. According to the invention, positional correction is carried out as follows: when a positional misalignment arises between the positioning pins and the pin bores, tapers provided at distal ends of the positioning pins guide the positioning pins into the respective pin bores, whereby the entire port door having a floating structure is positioned in alignment with the FOUP door. In order to impart a floating structure to the port door, needless to say, a floating structure must be imparted to all of related components, such as latch keys and suction piping for providing a vacuum for vacuum-chucking the FOUP door. Thus, a very complicated structure results. Also, a large number of components are required. This is accompanied by deterioration in maintainability and increase in manufacturing cost. Further, according to the invention, the positioning pins advance and retreat while being subjected to a radial force; thus, particles are generated through mutual rubbing of components.

Patent Document 1: Japanese Patent Application Laid-Open (kokai) No. 2002-68362

DISCLOSURE OF THE INVENTION

Problems to be Solved by the Invention

An object of the present invention is to solve the above-mentioned problems in the conventional FOUP door positioning device of a FOUP opener and to provide a FOUP door positioning device of a FOUP opener which is compatible with all kinds of FOUPs, is inexpensive, and has a simple positioning-pin adjustment mechanism.

Specifically, an object of the present invention is to provide a FOUP door positioning device of a FOUP opener in which positioning pins are attached to a port door of the FOUP opener in such a manner as to be tiltable, for alignment with the position of the FOUP door, in any direction 360 degrees therearound so as to absorb a positional error of up to 2 mm in relation to the center axes of the positioning pins and 360 degrees therearound.

Means for Solving the Problems

To achieve the above object, the present invention provides the following FOUP door positioning device of a FOUP opener.

There is provided a FOUP door positioning device of a FOUP opener configured such that a plurality of positioning pins attached to an outer surface of a port door of the FOUP opener at a plurality of positions are engaged with a plurality of respective pin bores formed in an outer surface of a FOUP door at a plurality of positions, whereby the FOUP door and the port door are aligned with each other at a preset position and the FOUP door is held by the port door, and, in this state, a plurality of suction pads attached to the outer surface of the port door at a plurality of positions vacuum-chuck the FOUP door. In the FOUP door positioning device of the FOUP opener, the positioning pins are attached to the outer surface of the port door by means of respective positioning-adjusting mounting members and are tiltable in any direction 360 degrees therearound.

According to the FOUP door positioning device of the FOUP opener, even when the positions of the positioning pins attached to the outer surface of the port door and the positions of the pin bores formed in the outer surface of the FOUP door are misaligned from each other, the positioning pins can be tilted by a predetermined amount in a direction associated with the misalignment. Thus, while being tilted, the positioning pins enter the respective pin bores, so that the port door can hold the FOUP door, and the suction pads can vacuum-chuck the FOUP door.

Thus, the FOUP opener can position the FOUP door at a predetermined position and can vacuum-chuck and hold the FOUP door. Therefore, the present invention can provide a FOUP door positioning device of a FOUP opener which eliminates the need to employ a complicated alignment mechanism for aligning the positioning pins of the port door with the positions of the pin bores of the FOUP door, is compatible with all kinds of FOUPs, is inexpensive, and has a simple positioning-pin adjustment mechanism.

According to a preferred embodiment, in the FOUP door positioning device of the FOUP opener, the positioning-adjusting mounting members are the suction pads; each of the suction pads is formed of an elastic material, has a base portion and a suction brim portion, which projects frontward from an outer peripheral edge of a front side of the base portion and opens frontward in the form of a bell, and has a pin insertion hole formed in a central region of the base portion in the form of a through-hole and allowing a straight portion of the corresponding positioning pin to be inserted therethrough; each of the positioning pin has a flange portion formed at its proximal end portion and has an air suction bore extending axially through its axial core region; the port door has recess portions formed on its outer surface and to which the respective positioning pins are attached, and air suction bores are formed in central regions of the respective recess portions in the form of through-holes; and in a state in which the flange portions of the positioning pins are seated in the respective recess portions of the port door, and the air suction bores of the positioning pins and the air suction bores of the port door are aligned with each other, the pin insertion holes of the suction pads are fitted to the straight portions of the respective positioning pins, and the suction pads are fixed to the port door, whereby the suction pads are attached to the outer surface of the port door, and portions of the suction pads which are sunk into the respective recess portions press the flange portions of the respective positioning pins.

By virtue of the above configuration, even when the positions of the positioning pins attached to the outer surface of the port door and the positions of the pin bores formed in the outer surface of the FOUP door are misaligned from each other, the suction pads can vacuum-chuck the FOUP in the following manner. When the positioning pins are guided into the respective pin bores, the positioning pins tilt by a predetermined amount in a direction associated with the misalignment, while the flange portions of the proximal end portions of the positioning pins one-sidedly lift portions of the respective suction pads which are sunk into the respective recess portions of the port door, thereby elastically deforming the portions of the respective suction pads. Thus, while maintaining the tilted posture, the positioning pins enter the respective pin bores, so that the port door can hold the FOUP door, and the suction pads can vacuum-chuck the FOUP door by means of a vacuum pressure applied through the air suction bores of the port door and the air suction bores of the positioning pins.

Thus, the following effect can further be yielded. The positioning pin and the suction pad that are paired can be attached to the outer surface of the port door at the same position, and the suction pads can be utilized for fixing the positioning pins. Therefore, the structure of the port door becomes simple.

According to another preferred embodiment, the flange portion of each of the positioning pins is a truncated cone portion formed by forming a taper on the proximal end portion of the positioning pin such that its diameter increases toward a proximal end of the positioning pin. This configuration enables the positioning pins to more smoothly perform operation for alignment with the respective pin bores of the FOUP door, thereby facilitating FOUP door positioning by the FOUP opener.

According to yet another preferred embodiment, each of the positioning pins has a taper formed on its distal end portion such that a diameter of the taper reduces toward its distal end. This configuration enables the positioning pins to more smoothly perform operation for alignment with the respective pin bores of the FOUP door, thereby facilitating FOUP door positioning by the FOUP opener.

According to still another preferred embodiment, a reinforcing metal plate is embedded in the base portion of each of the suction pads. By virtue of this configuration, while the mechanical strength of the suction pads is secured, elasticity can be maintained for enabling the tilting movement of the positioning pins.

Effects of the Invention

As mentioned above, according to the FOUP door positioning device of the FOUP opener, even when the positions of the positioning pins attached to the outer surface of the port door and the positions of the pin bores formed in the outer surface of the FOUP door are misaligned from each other, the positioning pins can be tilted by a predetermined amount in a direction associated with the misalignment. Thus, while being tilted, the positioning pins enter the respective pin bores, so that the port door can hold the FOUP door, and the suction pads can vacuum-chuck the FOUP door.

Thus, the FOUP opener can position the FOUP door at a predetermined position and can vacuum-chuck and hold the FOUP door. Therefore, the present invention can provide a FOUP door positioning device of a FOUP opener which eliminates the need to employ a complicated alignment mechanism for aligning the positioning pins of the port door with the positions of the pin bores of the FOUP door, is compatible with all kinds of FOUPs, is inexpensive, and has a simple positioning-pin adjustment mechanism.

Also, in the case where the positioning-adjusting mounting members are the suction pads, the positioning pin and the suction pad that are paired can be attached to the outer surface of the port door at the same position, and the suction pads can be utilized for fixing the positioning pins. Therefore, the structure of the port door becomes simple.

Also, in the case where the flange portion of each of the positioning pins is a truncated cone portion formed by forming a taper on the proximal end portion of the positioning pin such that its diameter increases toward a proximal end of the positioning pin or where each of the positioning pins has a taper formed on its distal end portion such that a diameter of the taper reduces toward its distal end, movement of the positioning pins for alignment with the respective pin bores of the FOUP door is performed more smoothly, thereby facilitating FOUP door positioning by the FOUP opener.

Further, in the case where a reinforcing metal plate is embedded in the base portion of each of the suction pads, while the mechanical strength of the suction pads is secured, elasticity can be maintained for enabling the tilting movement of the positioning pins.

DESCRIPTION OF REFERENCE NUMERALS

Figure 1:
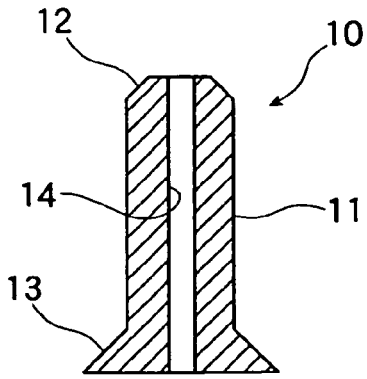
FIG. 1 is a sectional view of a positioning pin used in a FOUP door positioning device of a FOUP opener according to an embodiment of the present invention.

10: positioning pin; 11: straight portion; 12: taper; 13: taper (truncated cone portion, flange portion); 14: air suction bore; 20: suction pad (positioning-adjusting mounting member); 21: base portion; 22: suction brim portion; 23: pin insertion hole; 24: threaded hole (tapped bolt hole); 25: annular metal plate; 30: port door; 31: recess portion; 32: air suction bore; 33: threaded hole (tapped bolt hole);. 40: bolt; 50: FOUP door; 51: pin bore; 52: taper

BEST MODE FOR CARRYING OUT THE INVENTION

A FOUP door positioning device of a FOUP opener is configured such that a plurality of positioning pins attached to an outer surface of a port door of the FOUP opener at a plurality of positions are engaged with a plurality of respective pin bores formed in an outer surface of a FOUP door at a plurality of positions, whereby the FOUP door and the port door are aligned with each other at a preset position and the FOUP door is held by the port door, and, in this state, a plurality of suction pads attached to the outer surface of the port door at a plurality of positions vacuum-chuck the FOUP door. In the FOUP door positioning device, the positioning pins are attached to the outer surface of the port door by means of respective positioning-adjusting mounting members and are tiltable in any direction 360 degrees therearound.

Specifically, the positioning-adjusting mounting members are the suction pads; each of the suction pads is formed of an elastic material, has a base portion and a suction brim portion, which projects frontward from an outer peripheral edge of a front side of the base portion and opens frontward in the form of a bell, and has a pin insertion hole formed in a central region of the base portion in the form of a through-hole and allowing a straight portion of the corresponding positioning pin to be inserted therethrough. Each of the positioning pins has a taper formed on its distal end portion such that a diameter of the taper reduces toward its distal end, has a taper formed on its proximal end portion such that a diameter of the taper increases toward its proximal end, and has an air suction bore extending axially through its axial core region.

In a state in which the flange portions of the positioning pins are seated in the respective recess portions of the port door, and the air suction bores of the positioning pins and the air suction bores of the port door are aligned with each other, the pin insertion holes of the suction pads are fitted to the straight portions of the respective positioning pins, and the suction pads are fixed to the port door by screwing or the like, whereby the suction pads are attached to the outer surface of the port door, and portions of the suction pads which are sunk into the respective recess portions press the flange portions of the respective positioning pins. A reinforcing metal plate is embedded in the base portion of each of the suction pads.

EMBODIMENT

Next, an embodiment of the present invention will be described.

Figure 2:
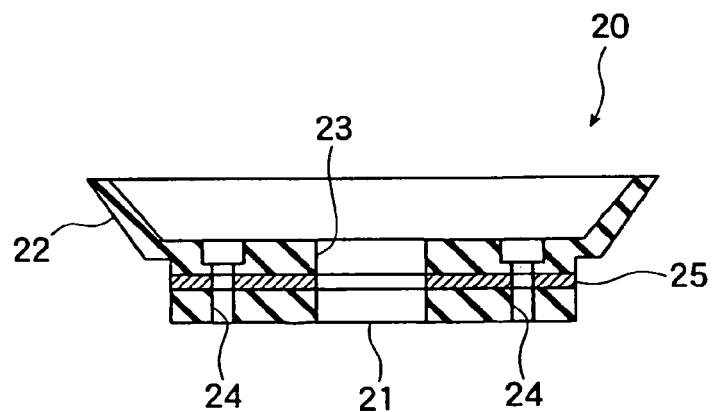
FIG. 2 is a sectional view of a suction pad used in the FOUP door positioning device of the FOUP opener according to the embodiment.
Figure 3:
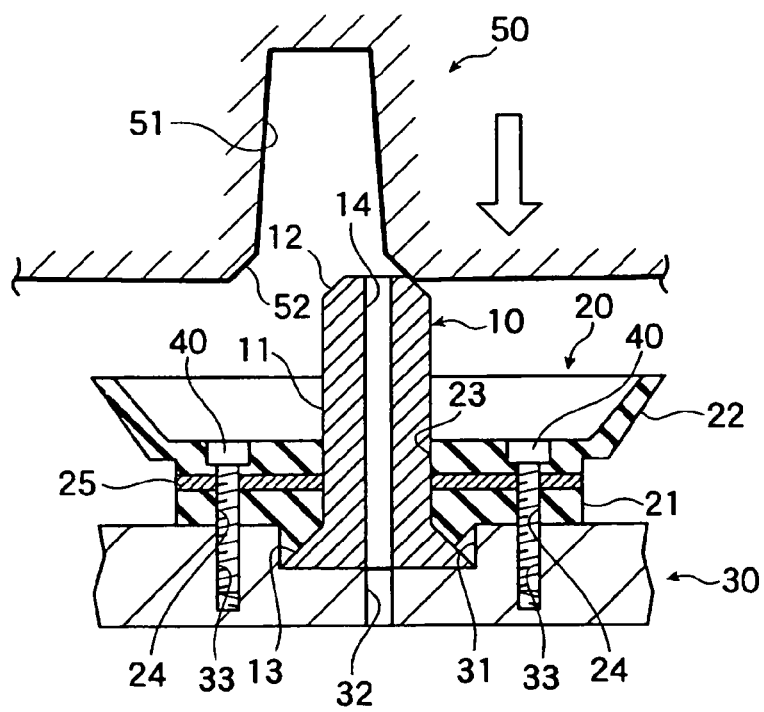
FIG. 3 is a sectional view showing a state immediately before a FOUP door is positioned by means of the positioning pin and the suction pad which are attached to the outer surface of a port door of the FOUP opener.
Figure 4:
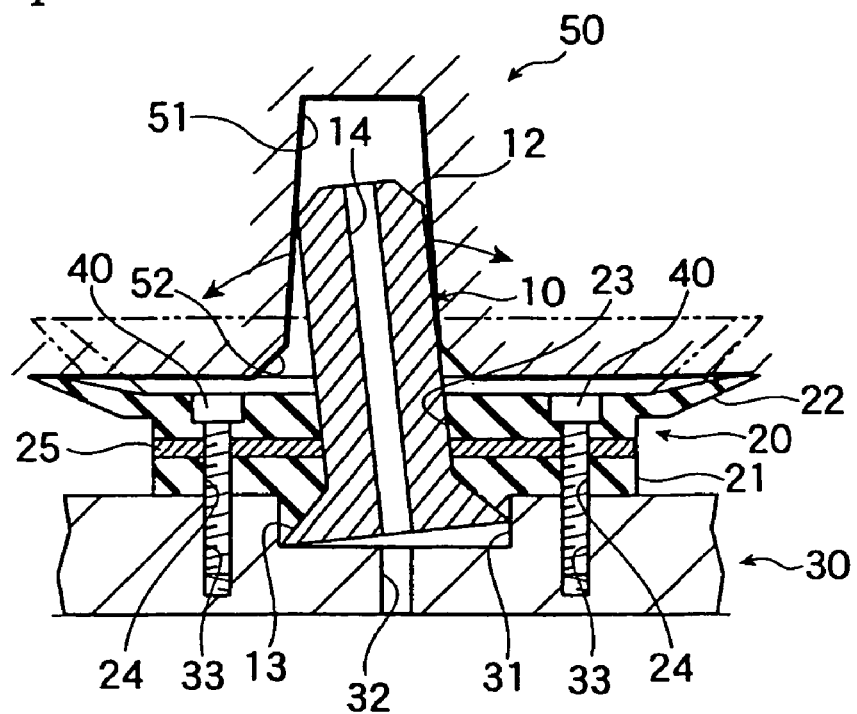
FIG. 4 is a sectional view showing a state in which the FOUP door is in the process of positioning by means of the positioning pin and the suction pad.
Figure 5:
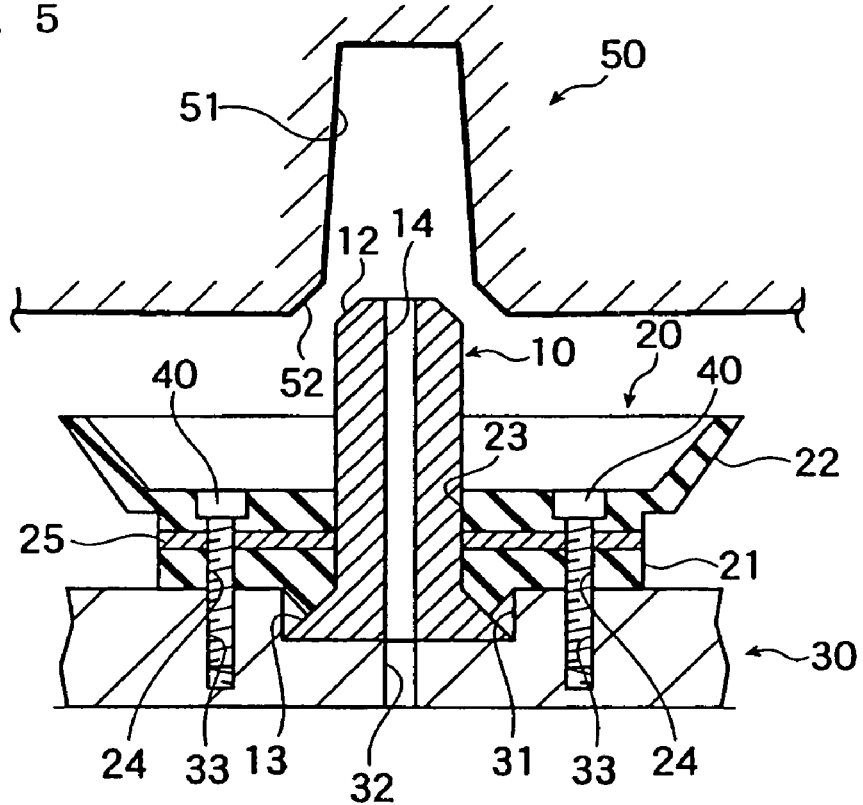
FIG. 5 is a sectional view showing a state in which the positioned FOUP door is separated from the port door.

FIG. 1 is a sectional view of a positioning pin used in a FOUP door positioning device of a FOUP opener of the present embodiment; FIG. 2 is a sectional view of a suction pad used in the FOUP door positioning device of the FOUP opener according to the present embodiment; FIG. 3 is a sectional view showing a state immediately before a FOUP door is positioned by means of the positioning pin and the suction pad which are attached to the outer surface of a port door of the FOUP opener; FIG. 4 is a sectional view showing a state in which the FOUP door is in the process of positioning by means of the positioning pin and the suction pad; and FIG. 5 is a sectional view showing a state in which the positioned FOUP door is separated from the port door.

As shown in FIG. 1, a positioning pin 10 used in the FOUP door positioning device of the FOUP opener of the present embodiment has a taper 12 formed on its distal end portion such that the diameter of the taper 12 reduces toward its distal end; has a taper 13 formed on its proximal end portion such that the diameter of the taper 13 increases toward its proximal end; and has a straight portion 11 extending between the distal end portion and the proximal end portion in the form of a rod having a uniform diameter. Also, the positioning pin 10 has an air suction bore 14 extending axially through its axial core region. The proximal end portion on which the taper 13 is formed assumes the form of a truncated cone.

The shape of a truncated cone which is assumed by the proximal end portion having the taper 13 can be replaced with the shape of a mere flange having an increased diameter, or a like form. The proximal end portion may be formed into a flange-like shape which encompasses these shapes. However, according to experiments conducted by the present inventor et al., the form of a truncated cone enables the positioning pin 10 to more smoothly perform operation for alignment with a pin bore 51 (which will be described later) of a FOUP door 50 and is thus preferred. The taper 12 on the distal end portion is not necessarily required, since an opening portion of the pin bore 51 is tapered according to the standard.

A suction pad (positioning-adjusting mounting member) 20 for use in the FOUP door positioning device of the FOUP opener of the present embodiment is made of an elastic material, such as silicone. As shown in FIG. 2, the suction pad 20 includes a relatively thick, disklike base portion 21 and a suction brim portion 22, which projects frontward from an outer peripheral edge of a front side of the base portion 21 and opens frontward in the form of a bell. The suction pad 20 has a pin insertion hole 23 formed in a central region of the base portion 21 in the form of a through-hole and allowing the straight portion 11 of the positioning pin 10 to be inserted therethrough. The suction pad 20 also has at least two threaded holes (tapped bolt holes) 24 in the base portion 21, which are formed in the form of through-holes and are located on the opposite sides of the pin insertion hole 23. In order to impart mechanical strength to a core region of the base portion 21, a reinforcing annular metal plate 25 is embedded in the base portion 21.

Further, as shown in FIG. 3, a port door 30 for use in the FOUP door positioning device of the FOUP opener of the present embodiment has a recess portion 31 formed in its outer surface (a surface which faces a FOUP door 50, which will be described later) at a position where the positioning pin 10 is attached; an air suction bore 32 is formed in a central region of the recess portion 31 in the form of a through-hole; and at least two threaded holes (tapped bolt holes) 33 are formed and located diagonally with the recess portion 31 located therebetween. The recess portion 31 is formed to have such a size that a proximal end portion of the positioning pin 10 can be seated and received therein.

The positioning pin 10 and the suction pad 20 are attached to the outer surface of the port door 30 in the following manner.

As shown in FIG. 3, first, a proximal end portion (truncated cone portion where the taper 13 is formed) of the positioning pin 10 is seated and received in the recess portion 31 of the port door 30. Next, in a state in which the air suction bore 14 of the positioning pin 10 and the air suction bore 32 of the port door 30 are aligned with each other, the pin insertion hole 23 of the suction pad 20 is fitted to the straight portion 11 of the positioning pin 10, thereby fitting the suction pad 20 to the positioning pin 10. Then, the threaded holes 24 of the suction pad 20 and the threaded holes 33 of the port door 30 are aligned with each other; subsequently, bolts 40 are tightly screwed into the aligned threaded holes 24 and 33, thereby securely joining the suction pad 20 to the port door 30. By this procedure, while a contact portion of the suction pad 20 in contact with the outer surface of the port door 30 is elastically deformed in such a manner that its thickness is compressed, the suction pad 20 is attached to the outer surface of the port door 30; furthermore, a central portion (a portion around the opening of the pin insertion hole 23) located radially inward of the contact portion is sunk into the recess portion 31 of the port door 30, thereby pressing the proximal end portion of the positioning pin 10 from above. By this procedure, the positioning pin 10 and the suction pad 20 are securely attached to the outer surface of the port door 30. The suction pad 20 also serves as a mounting member for mounting the positioning pin 10 on the outer surface of the port door 30; furthermore, the elasticity of the suction pad 20 allows the positioning pin 10 to be tiltable by a predetermined amount in any direction 360 degrees therearound. Therefore, the suction pad 20 can be said to also serve as a positioning-adjusting mounting member.

Next, positioning operation which the positioning pin 10 performs for alignment with the FOUP door 50 will be described with reference to FIGS. 3 to 5.

FIG. 3 shows a state immediately before the positioning pin 10 is inserted into the pin bore 51 of the FOUP door 50. A taper 52 is formed at the inlet of the pin bore 51 in accordance with the SEMI standard. When the position of the pin bore 51 and the position of the positioning pin 10 are slightly misaligned from each other, in the course of the FOUP door 50 and the port door 30 approaching each other, the taper 52 of the pin bore 51 and the taper 12 of the distal end of the positioning pin 10 collide with each other and slide on each other within a range of a minute play between the FOUP door 50 and the port door 30, whereby the port door 30 attempts to guide the positioning pin 10 into the pin bore 51.

However, since the port door 30 does not have an alignment mechanism, in the course of further mutual approach of the FOUP door 50 and the port door 30, the taper 12 and the taper 52 slide further on each other while the positioning pin 10 is tilted toward the pin bore 51 of the FOUP door 50. Then, at last, as shown in FIG. 4, the taper 12 and the taper 52 finish sliding on each other; the taper 12 leaves the taper 52; and a distal end portion of the positioning pin 10 enters deep into the pin bore 51. At the same time, the front surface (which faces the port door 30) of the FOUP door 50 and an outer peripheral edge of the suction brim portion 22 of the suction pad 20 come into contact with each other. Upon establishment of this state, the port door 30 can hold the FOUP door 50. Thus, a vacuum pressure is led into a space enclosed by the front surface of the FOUP door 50 and the suction pad 20 through the air suction bore 32 of the port door 30 and the air suction bore 14 of the positioning pin 10, whereby the suction pad 20 vacuum-chucks the FOUP door 50. By this procedure, the port door 30 vacuum-chucks and holds the FOUP door 50.

In this case, in the course of the further mutual approach of the FOUP door 50 and the port door 30, the positioning pin 10 can be tilted toward the pin bore 51 of the FOUP door 50 by virtue of the following: a proximal end portion (truncated cone portion where the taper 13 is formed) of the positioning pin 10 one-sidedly lifts a portion of the base portion 21 of the suction pad 20 formed of an elastic material, the portion being sunk into the recess portion 31, thereby elastically deforming the sunken portion and a portion in the vicinity of the pin insertion hole 23 (see FIG. 4). As a result of this tilt, the proximal end face of the positioning pin 10 slightly rises from the bottom surface of the recess portion 31.

In the present embodiment, the FOUP door positioning adjustment mechanism provided in the FOUP door positioning device of the FOUP opener is an assembly formed by assembling the positioning pin 10, the suction pad 20, and the port door 30 as mentioned above and in which the positioning pin 10 performs positioning operation for alignment with the FOUP door 50 as mentioned above.

An unillustrated horizontally-vertically moving mechanism moves the port door 30 which vacuum-chucks and holds the FOUP door 50, to a predetermined region in a second controlled space within a processing apparatus. By this procedure, the FOUP door 50 withdraws to a position for enabling transfer of a workpiece contained in a FOUP (not shown) between a first controlled space within the FOUP and the second controlled space within the processing apparatus. During the procedure, the workpiece to be transferred is not exposed to the atmosphere of an external contaminated space.

The workpiece which has undergone a predetermined processing in the processing apparatus is returned into the FOUP. Then, an opening portion of the FOUP is closed again by the FOUP door 50. FIG. 5 shows a state in which, in order to close again the opening portion of the FOUP by the FOUP door 50, the port door 30 has cancelled vacuum-chucking and holding of the FOUP door 50. In this state, the positioning pin 10 is separated from the pin bore 51 of the FOUP door 50.

As mentioned before, since the suction pad 20 is securely screwed to the port door 30, its central portion (a portion around the opening of the pin insertion hole 23) located radially inward of its contact portion in contact with the outer surface of the port door 30 is sunk into the recess portion 31 of the port door 30 (see FIG. 3). The central portion of the suction pad 20 sunk into the recess portion 31 presses the root (proximal end portion) of the positioning pin 10. Thus, when the positioning pin 10 is separated from the pin bore 51 of the FOUP door 50 as shown in FIG. 5, the central portion of the suction pad 20 is elastically restored to its original state, thereby restoring the root of the positioning pin 10 to its original state. Therefore, in a state in which the port door 30 does not hold the FOUP door 50, the positioning pin 10 is always centered.

The FOUP door positioning device of the FOUP opener of the present embodiment is configured as described above and thus can yield the following effects.

Even when the position of the positioning pin 10 attached to the port door 30 and the position of the pin bore 51 formed in the FOUP door 50 are misaligned from each other, the suction pad 20 can vacuum-chuck the FOUP door 50 in the following manner. When the positioning pin 10 is guided into the pin bore 51, the positioning pin 10 tilts by a predetermined amount in a direction associated with the misalignment, while the taper 13 of the proximal end portion (truncated cone portion) of the positioning pin 10 one-sidedly lifts a portion of the suction pad 20 which is sunk into the recess portion 31 of the port door 30, thereby elastically deforming the portion of the suction pad 20. Thus, while maintaining the tilted state, the positioning pin 10 enters the pin bore 51, so that the port door 30 can hold the FOUP door 50, and the suction pad 20 can vacuum-chuck the FOUP door 50 by means of a vacuum pressure applied through the air suction bore 32 of the port door 30 and the air suction bore 14 of the positioning pin 10.

Thus, the FOUP opener can position the FOUP door 50 at a predetermined position and can vacuum-chuck and hold the FOUP door 50. Therefore, the present embodiment can provide a FOUP door positioning device of a FOUP opener which eliminates the need to employ a complicated alignment mechanism for aligning the positioning pin 10 of the port door 30 with the position of the pin bore 51 of the FOUP door 50, is compatible with all kinds of FOUPs, is inexpensive, and has a simple positioning-pin adjustment mechanism.

Particularly, the flange portion of the positioning pin 10 is a truncated cone portion formed by forming the taper 13 on the proximal end portion of the positioning pin 10 such that its diameter increases toward the proximal end of the positioning pin 10. Also, the positioning pin 10 has the taper 12 formed on its distal end portion such that the diameter of the taper 12 reduces toward its distal end. These features enable the positioning pin 10 to more smoothly perform operation for alignment with the pin bore 51, thereby facilitating FOUP door positioning by the FOUP opener.

Also, the positioning pin 10 and suction pad 20 that are paired can be attached to the outer surface of the port door 30 at the same position, and the suction pad 20 can be utilized for fixing the positioning pin 10. Therefore, the structure of the port door 30 becomes simple.

Also, since the reinforcing metal plate 25 is embedded in the base portion of the suction pad 20, while the mechanical strength of the suction pad 20 is secured, elasticity can be maintained for enabling the tilting movement of the positioning pin 10.

The present invention is not limited to the above-described embodiment. Numerous modifications and variations of the present invention are possible without departing from the gist of the invention.

The invention claimed is:

1. A FOUP door positioning device of a FOUP opener comprises;
   a plurality of positioning pins attached to an outer surface of a port door of the FOUP opener at a plurality of positions;
   a plurality of respective pin bores formed in an outer surface of a FOUP door at a plurality of positions, which pin bores respectively receive the plurality of positioning pins, whereby the FOUP door and the port door are aligned with each other at a preset position and the FOUP door is held by the port door and aligned in the preset position;
   a plurality of suction pads attached to the outer surface of the port door at a plurality of positions to vacuum-chuck the FOUP door;
   a plurality of positioning-adjusting mounting members which attach the positioning pins to the outer surface of the port door each of the positioning pins being biased by a positioning-adjusting mounting member toward a position perpendicular to the port door and being tiltable within the positioning-adjusting mounting member in any direction 360 degrees therearound, each of the positioning-adjusting mounting members including a disk-shaped base portion which is formed of an elastic material and has a pin insertion hole formed in a central region thereof in the form of a through-hole, a straight portion of the positioning pin being inserted through the pin insertion hole, the straight portion being located between a distal end portion and a proximal end portion of the positioning pin; and
   wherein, the base portion of the positioning-adjusting mounting member surrounds and supports a part of the straight portion of the positioning pin, located near the proximal end portion of the positioning pin.

2. A FOUP door positioning device of a FOUP opener according to claim 1, wherein:
   the proximal end portion of each positioning pin has a flange portion which is in contact with a back surface of a base portion of the positioning-adjusting mounting member which surrounds the part of the straight portion of the positioning pin located near the proximal end portion of the positioning pin.

3. A FOUP door positioning device of a FOUP opener according to claim 2, wherein:
   recesses are formed in the outer surface of the port door at positions where the positioning pins are to be attached; and
   the flange portions of the positioning pins are seated in the respective recesses of the port door.

4. A FOUP door positioning device of a FOUP opener according to claim 3, wherein the flange portion of each positioning pin is a truncated cone portion formed as a taper on the proximal end portion of the positioning pin, wherein the truncated cone portion has a diameter which increases toward the proximal end of the positioning pin.

5. A FOUP door positioning device of a FOUP opener according to claim 2 wherein the flange portion of each positioning pin is a truncated cone portion formed as a taper on the proximal end portion of the positioning pin, wherein the truncated cone portion has a diameter which increases toward the proximal end of the positioning pin.

6. A FOUP door positioning device of a FOUP opener according to claim 1, wherein:
   the positioning-adjusting mounting members are the suction pads;
   each of the suction pads has a disk-shaped base portion formed of an elastic material and a suction brim portion formed of an elastic material, which suction brim portion projects frontward from an outer peripheral edge of a front side of the base portion, opens frontward in the form of a bell, and has a pin insertion hole formed in a central region of the disk-shaped base portion; and
   the proximal end portion of each positioning pin has a flange portion which is in contact with a back surface of a base portion of the positioning-adjusting mounting member, the base portion surrounding and supporting a part of the straight portion of the positioning pin located near the proximal end portion of the positioning pin.

7. A FOUP door positioning device of a FOUP opener according to claim 6, wherein:
   recesses are formed in the outer surface of the port door at positions where the positioning pins are to be attached; and
   the flange portions of the positioning pins are seated in the respective recesses of the port door.

8. A FOUP door positioning device of a FOUP opener according to claim 7, wherein the flange portion of each positioning pin is a truncated cone portion in the form of a taper on the proximal end portion of the positioning pin, wherein the truncated cone portion has a diameter which increases toward the proximal end of the positioning pin.

9. A FOUP door positioning device of a FOUP opener according to claim 6, wherein the flange portion of each positioning pin is a truncated cone portion in the form of a taper on the proximal end portion of the positioning pin, wherein the truncated cone portion has a diameter which increases toward the proximal end of the positioning pin.

* * * * *